United States Patent
Krutsick et al.

(10) Patent No.: US 8,035,196 B2
(45) Date of Patent: Oct. 11, 2011

(54) METHODS OF COUNTER-DOPING COLLECTOR REGIONS IN BIPOLAR TRANSISTORS

(75) Inventors: Thomas J. Krutsick, Fleetwood, PA (US); Christopher J. Speyer, Spicewood, TX (US)

(73) Assignee: Zarlink Semiconductor (US) Inc., Austin, TX (US)

( * ) Notice: Subject to any disclaimer, the term of this patent is extended or adjusted under 35 U.S.C. 154(b) by 364 days.

(21) Appl. No.: 12/061,264

(22) Filed: Apr. 2, 2008

(65) Prior Publication Data

US 2009/0250789 A1 Oct. 8, 2009

(51) Int. Cl.
*H01L 29/73* (2006.01)
*H01L 21/331* (2006.01)

(52) U.S. Cl. ........ 257/611; 257/607; 257/565; 257/592; 257/E21.144; 257/E21.468; 438/309; 438/311; 438/341; 438/369; 438/373; 438/374; 438/376

(58) Field of Classification Search .................. 257/592, 257/325, 607, 611, 655, 598; 438/369, 370, 438/373, 374, 376, 514, 519, 527, 766
See application file for complete search history.

(56) References Cited

U.S. PATENT DOCUMENTS

| | | | | |
|---|---|---|---|---|
| 4,835,115 A * | 5/1989 | Eklund | | 438/426 |
| 4,956,305 A * | 9/1990 | Arndt | | 438/203 |
| 5,198,692 A * | 3/1993 | Momose | | 257/591 |
| 5,258,644 A * | 11/1993 | Tamba et al. | | 257/561 |
| 5,545,908 A * | 8/1996 | Tokura et al. | | 257/341 |
| 6,025,237 A * | 2/2000 | Choi | | 438/301 |
| 6,140,205 A * | 10/2000 | Jennings | | 438/406 |
| 6,174,778 B1 * | 1/2001 | Chen et al. | | 438/302 |
| 6,184,112 B1 * | 2/2001 | Maszara et al. | | 438/528 |
| 6,352,887 B1 * | 3/2002 | Hutter et al. | | 438/202 |
| 6,894,366 B2 * | 5/2005 | Howard et al. | | 257/565 |
| 7,037,799 B2 * | 5/2006 | Hutcheson | | 438/350 |
| 7,595,570 B2 * | 9/2009 | Landmann | | 307/119 |
| 7,838,930 B1 * | 11/2010 | Bulucea | | 257/335 |
| 2002/0079507 A1 * | 6/2002 | Shim et al. | | 257/192 |
| 2003/0104658 A1 * | 6/2003 | Furukawa et al. | | 438/151 |
| 2006/0046415 A1 * | 3/2006 | Hamaguchi | | 438/373 |
| 2006/0194408 A1 * | 8/2006 | Leonardi et al. | | 438/404 |
| 2007/0264795 A1 * | 11/2007 | Miller et al. | | 438/455 |
| 2007/0278539 A1 * | 12/2007 | Dyson et al. | | 257/256 |
| 2008/0217693 A1 * | 9/2008 | Wang et al. | | 257/352 |
| 2009/0250785 A1 * | 10/2009 | Krutsick et al. | | 257/526 |

* cited by examiner

*Primary Examiner* — Victor A Mandala
*Assistant Examiner* — William Harriston
(74) *Attorney, Agent, or Firm* — Williams, Morgan & Amerson

(57) ABSTRACT

The present invention provides a method of forming a bipolar transistor. The method includes doping a silicon layer with a first type of dopant and performing a first implant process to implant dopant of a second type opposite the first type in the silicon layer. The implanted dopant has a first dopant profile in the silicon layer. The method also includes performing a second implant process to implant additional dopant of the second type in the silicon layer. The additional implanted dopant has a second dopant profile in the silicon layer different than the first dopant profile. The method further includes growing an insulating layer formed over the silicon layer by consuming a portion of the silicon layer and the first type of dopant.

16 Claims, 5 Drawing Sheets

METHODS OF COUNTER-DOPING COLLECTOR REGIONS IN BIPOLAR TRANSISTORS

BACKGROUND

1. Field of the Invention

This application relates generally to bipolar transistors and, more particularly, to counter-doping collector regions of bipolar transistors.

2. Description of the Related Art

Bipolar transistors include an emitter region, a base region, and a collector region that are alternately doped with either n-type or p-type material. For example, an n-p-n bipolar transistor includes an emitter region that is doped with n-type material, a base region that is doped with p-type material, and a collector region that is doped with n-type material. For another example, a p-n-p bipolar transistor includes an emitter region that is doped with p-type material, a base region that is doped with n-type material, and a collector region that is doped with p-type material. The structure and operating parameters of a bipolar transistor are therefore determined, at least in part, by the dopant profiles that result from the specific process that is used to dope the emitter, base, and/or collector regions.

FIGS. 1A, 1B, and 1C conceptually illustrate a conventional technique for forming a collector of a p-n-p bipolar transistor. Initially, as shown in FIG. 1A, an SOI substrate 100 is used as the starting material. As depicted in FIG. 1A, the SOI substrate 100 is comprised of a bulk substrate 100a, a buried insulation layer 100b and an active layer 100c. Typically the bulk silicon 100a is comprised of silicon, the buried insulation layer 100b is comprised of silicon dioxide (a so-called "BOX" layer), and the active layer 100c is comprised of silicon (doped or undoped). Such SOI structures may be readily obtained from a variety of commercially known sources. Typically, the buried insulation layer 100b will be relatively thick for high voltage technologies, e.g., on the order of approximately 0.5-2 microns, and the active layer 100c may have an initial thickness of approximately 2 microns.

Thereafter, as indicated in FIG. 1A, a doped layer of silicon 105 is formed above the active layer 100c. The layer of silicon 105 is doped with an N-type dopant material, e.g., phosphorous, arsenic, such that it has a resistivity of approximately 1.6-4.5 ohm-cm which corresponds to a dopant concentration of approximately $1\text{-}3\times10^{15}$ ions/cm$^3$. The layer of silicon 105 is a layer of epitaxial silicon that is deposited in an epi reactor. In this situation, the layer of epitaxial silicon 105 may be doped by introducing dopant materials into an epi reactor during the process used to form the layer 105. However, the dopant material may also be introduced into the layer of silicon 105 by performing an ion implant process after the layer of silicon 105 is formed. Note that the distribution of dopant atoms within the layer of silicon 105 may not be uniform throughout its depth.

For purposes of explanation only, the drawings depict an interface between the active layer 100c and the layer of silicon 105. In practice, the distinction between these two layers may be very difficult to define. Nevertheless, the distinct layers are shown for purposes of explanation only. The layer of silicon 105 is relatively thick. In one illustrative embodiment, the layer of silicon 105 has a thickness that ranges from approximately 2-30 microns, depending on the particular application. Thereafter, an insulating or oxide layer 110 is formed above the layer of silicon 105 by performing, for example, a thermal oxidation process.

As shown in FIG. 1B a dopant implantation process (indicated by the arrows 115) may be performed to implant dopant species in the silicon layer 105. For example, the dopant implantation process 115 may be used to implant a p-type dopant such as boron into the silicon layer 105 to form a doped region 120. The doped region 120 may be referred to as a p-well. The dopant concentration in the doped region 120 is typically with in a range from about $3\times10^{14}$ to $3\times10^{16}$ ions/cm$^3$. A portion of the implanted dopant species may also remain within the oxide layer 110.

FIG. 2A schematically illustrates the dopant concentration as a function of depth into the oxide layer and the silicon layer. The dopant concentration is indicated along the vertical axis (in arbitrary units) and the depth is indicated along the horizontal axis (in arbitrary units). The boundary between the oxide layer and the silicon layer is indicated by the vertical dashed line. The concentration of the n-type dopant species in the oxide layer and the silicon layer is indicated by the dotted line 205 and the concentration of the implanted p-type dopant species is indicated by the solid line 210. The concentration of the implanted p-type dopant peaks slightly below the interface between the oxide layer and the silicon layer and then decreases with increasing depth into the silicon layer. The concentration of the n-type dopant is approximately constant within the two layers.

Referring now to FIG. 1C, a thermal oxidation process can be used to grow selected portions of the silicon dioxide layer 110. The thermal oxidation process is used to grow the portions 125(1-2) and a masking layer is used to prevent the region between these portions from growing. Thermal oxidation and the consequent growth of the portions 125 consume a portion of the doped region 120. In some cases, the dopant species that is used to dope the doped region 120 may tend to segregate because the dopant species tend to redistribute so that the chemical potential across the interface between the silicon dioxide layer 110 and the doped region 120 is approximately constant. This phenomenon is conventionally referred to as dopant segregation. For example, thermal oxidation can cause boron to migrate from the doped region 120 into the portions 125 of the silicon dioxide layer 110 to equalize the chemical potential across the interface. The dopant segregation may result in the concentration of the p-type dopant falling below the concentration of the n-type dopant in the doped region 120, thereby creating an inverted layer. The resulting n-type inverted layer can degrade the performance of the devices formed using this technique.

FIG. 2B schematically illustrates the dopant concentration as a function of depth into the oxide layer and the silicon layer following the thermal oxidation process. The dopant concentration is indicated along the vertical axis (in arbitrary units) and the depth is indicated along the horizontal axis (in arbitrary units). The boundary between the oxide layer and the silicon layer is indicated by the vertical dashed line. Thermal oxidation has increased the depth of the oxide layer, as indicated by the shift of the vertical dashed line to the right relative to FIG. 2A. The concentration of the n-type dopant species in the oxide layer and the silicon layer is indicated by the dotted line 205 and the concentration of the implanted p-type dopant species is indicated by the solid line 210. The dopant segregation has increased the concentration of the p-type dopant in the oxide layer and decreased the concentration of the p-type doping in the silicon layer. The concentration of the n-type dopant has slightly decreased in the oxide layer and increased near the surface of the silicon layer. Consequently, an inverted region 215 has formed near the interface between the silicon layer and the oxide layer.

The disclosed subject matter is directed to addressing the effects of one or more of the problems set forth above.

SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one embodiment, a method is provided for forming a p-well of a bipolar transistor. The method includes doping a silicon layer with a first type of dopant and performing a first implant process to implant dopant of a second type opposite the first type in the silicon layer. The implanted dopant has a first dopant profile in the silicon layer. The method also includes performing a second implant process to implant additional dopant of the second type in the silicon layer. The additional implanted dopant has a second dopant profile in the silicon layer different than the first dopant profile. The method further includes growing an insulating layer formed over the silicon layer by consuming a portion of the silicon layer and the first type of dopant.

In another embodiment, a bipolar transistor is provided. The bipolar transistor includes a substrate, a silicon layer formed over the substrate, and an insulating layer. The silicon layer is doped with a first type of dopant and then further doped by performing first and second implant process to implant dopant of a second type opposite the first type in the silicon layer. The implanted dopant has first and second dopant profiles in the silicon layer. The insulating layer is formed by depositing or growing an initial insulating layer and growing the initial insulating layer formed over the silicon layer by consuming a portion of the silicon layer and the second type of dopant.

BRIEF DESCRIPTION OF THE DRAWINGS

The disclosed subject matter may be understood by reference to the following description taken in conjunction with the accompanying drawings, in which like reference numerals identify like elements, and in which.

Figure 1A:
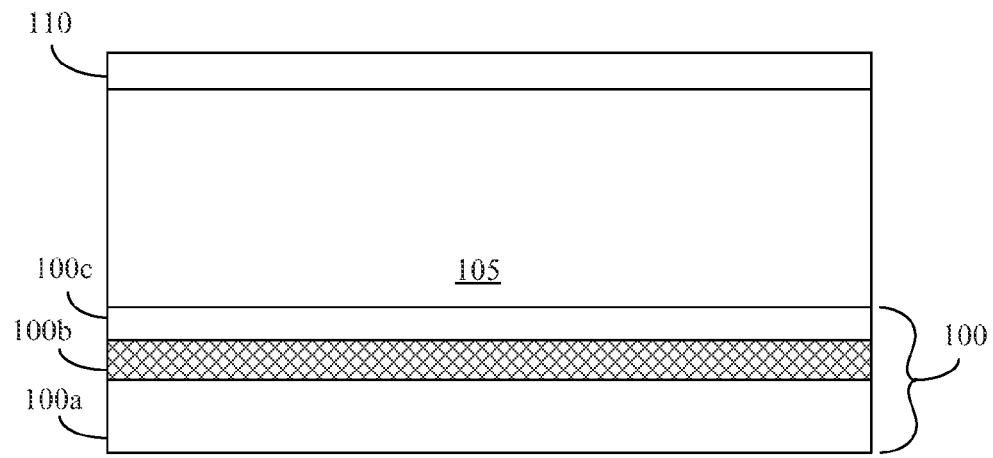
FIGS. 1A, 1B, and 1C conceptually illustrate a conventional technique for forming a collector of a p-n-p bipolar transistor.
Figure 1B:
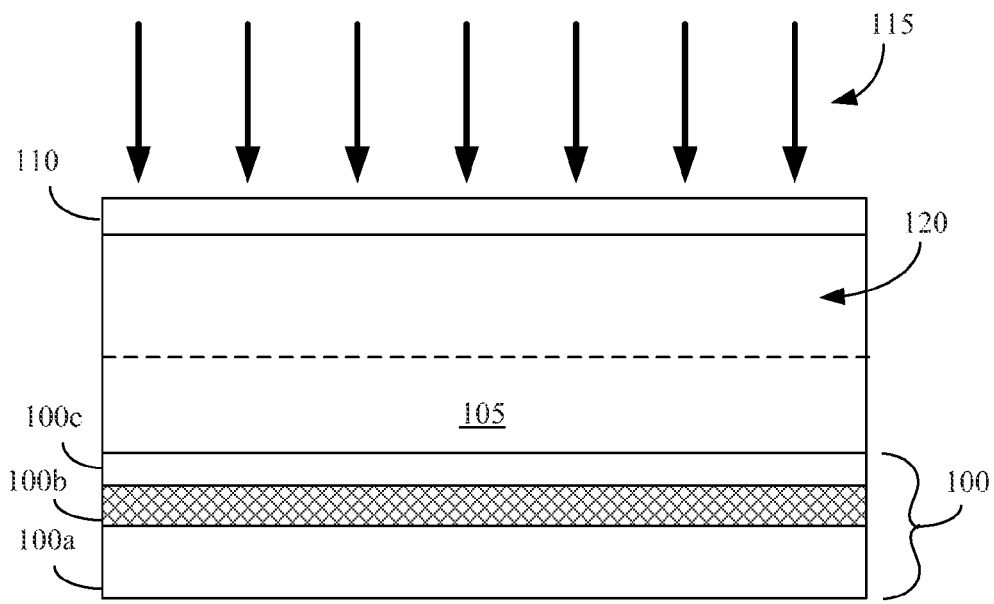
Figure 1C:
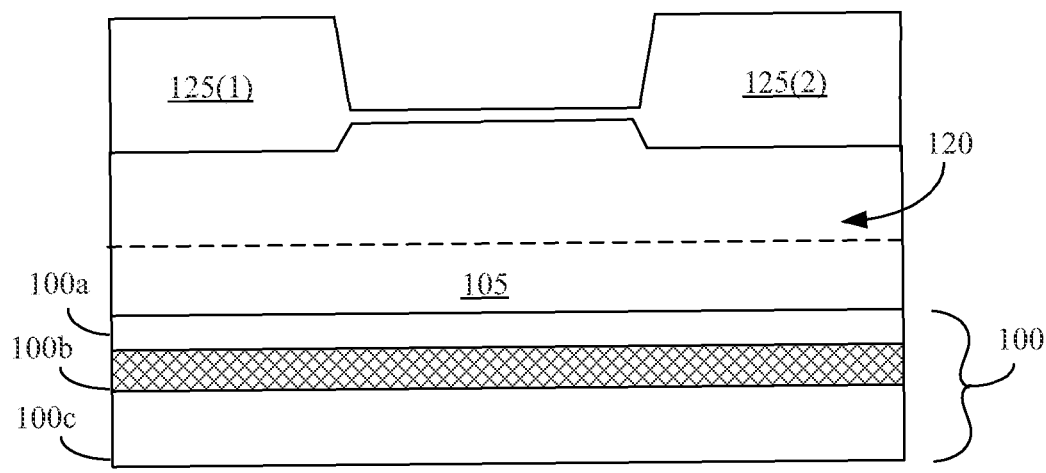
Figure 2A:
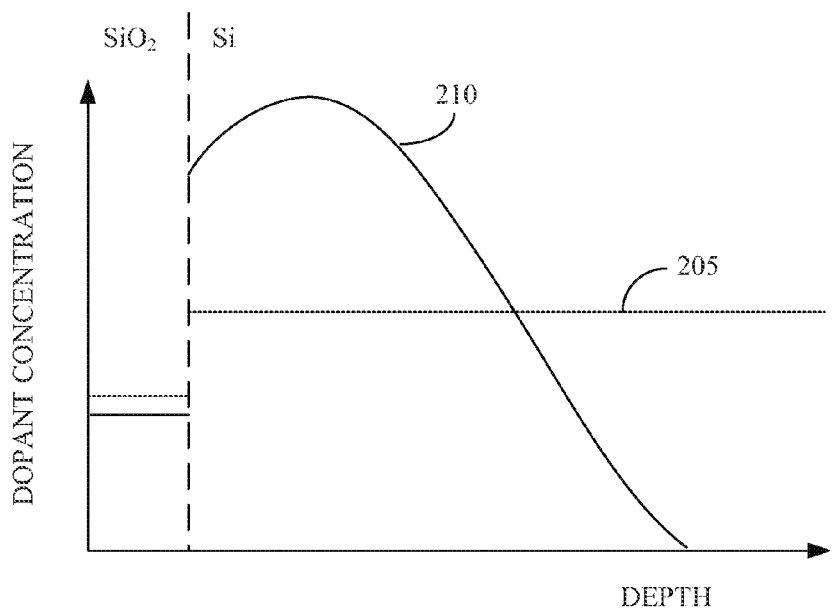
FIG. 2A schematically illustrates a dopant concentration as a function of depth into the oxide layer and the silicon layer of the conventional p-n-p bipolar transistor before thermal oxidation.
Figure 2B:
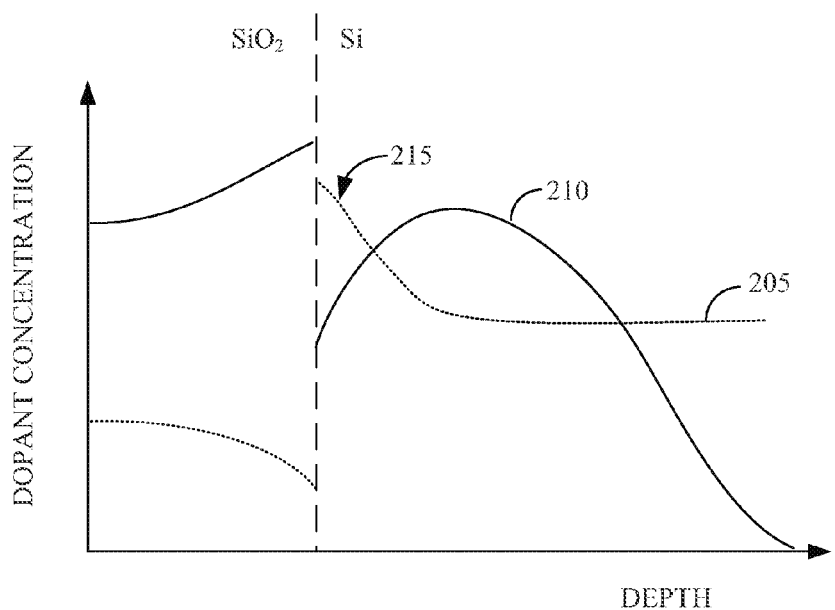
FIG. 2B schematically illustrates the dopant concentration as a function of depth into the oxide layer and the silicon layer following the thermal oxidation process used to form the conventional p-n-p bipolar transistor.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the disclosed subject matter as defined by the appended claims.

DETAILED DESCRIPTION OF SPECIFIC EMBODIMENTS

Illustrative embodiments of the disclosed subject matter are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 3A:
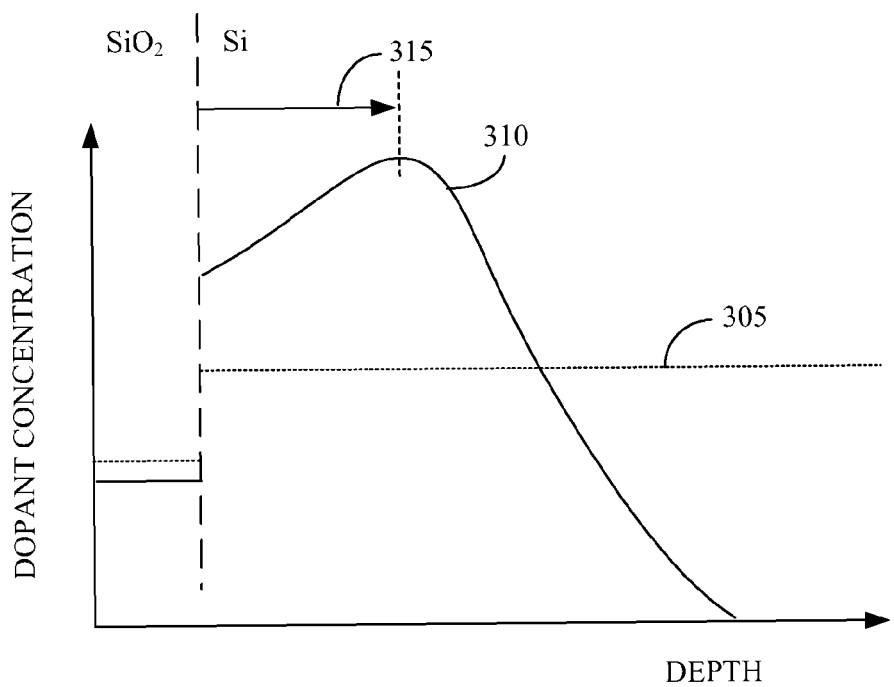
FIG. 3A schematically illustrates one exemplary embodiment of dopant concentrations in an oxide layer and a silicon layer that may be used to form a collector of a bipolar transistor.

FIG. 3A schematically illustrates one exemplary embodiment of dopant concentrations in an insulating layer formed of an oxide and a silicon layer that may be used to form a p-well of a bipolar transistor. The p-well may then be used to form a collector for the bipolar transistor. In the illustrated embodiment, the collector layer is formed of silicon and the oxide layers are formed of silicon dioxide. However, persons of ordinary skill in the art having benefit of the present disclosure should appreciate that the present invention is not limited to these particular materials. The dopant concentrations are plotted as a function of depth into the oxide layer and the silicon layer. The dopant concentration is indicated along the vertical axis (in arbitrary units) and the depth is indicated along the horizontal axis (in arbitrary units). The boundary between the oxide layer and the silicon layer is indicated by the vertical dashed line.

The illustrated embodiment depicts the dopant concentrations at an intermediate stage in the formation of the bipolar transistor. At this point in the formation process, the silicon layer and the oxide layer have been deposited and doped with two species of dopants that are opposite to each other. In one embodiment, the bipolar transistor is a p-n-p transistor and the concentration of the n-type dopant species in the oxide layer and the silicon layer is indicated by the dotted line 305. The n-type dopant may be implanted into the silicon and oxide layers after these layers have been deposited or, alternatively, the n-type dopant may be incorporated into the material as it is being deposited. The concentration of the n-type dopant is approximately constant within the two layers. The concentration of the implanted p-type dopant species (e.g., boron) is indicated by the solid line 310. The concentration of the implanted p-type dopant peaks at a depth 315 that is slightly below the interface between the oxide layer and the silicon layer and then decreases with increasing depth into the silicon layer. For example, the peak dopant concentration 310 in the doped region 310 may be on the order of $5 \times 10^{16}$ ions/cm$^3$. Persons of ordinary skill in the art having benefit of the present disclosure should appreciate that the bipolar transistor may alternatively be an n-p-n transistor, in which case the profiles 305, 310 represent p-type and n-type dopants, respectively.

Figure 3B:
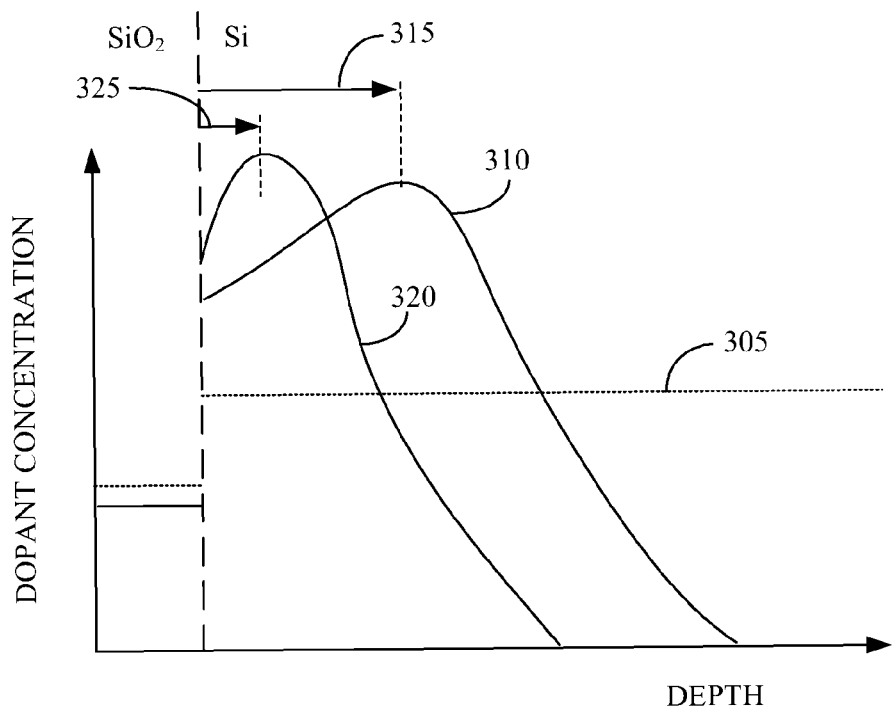
FIG. 3B depicts the dopant concentrations after a second doping process is used to implant additional dopants into the silicon layer.

FIG. 3B depicts the dopant concentrations after a second doping process is used to implant additional dopants into the silicon layer. In the illustrated embodiment, the second doping process is used to implant additional p-type dopants having a concentration 320 that peaks at a depth 325 into the silicon layer. The depth 325 is smaller than the depth 315 of the initially deposited p-type dopants. The relative depths 315, 325 may be selected and adjusted using a variety of techniques. In one embodiment, the dopant concentration 310 may be produced by implanting the dopant species using a relatively high energy, e.g., an energy larger than 30 keV, and the dopant concentration 320 may be produced by implanting the dopant species using a relatively low energy, e.g., an energy less than 30 keV. For example, the dopant concentration 310 may be produced by implanting the dopant species at approximately 300 keV and the dopant concentration 320 may be produced by implanting the dopant species at approximately 15-30 keV. However, the dopant depths may be controlled using other techniques (such as varying the depth of the oxide layer between the first and second doping processes) instead of or in addition to the variation in the implant energy. The peak dopant concentration 320 in the doped region may be on the order of $10^{17}$ ions/cm$^3$.

Figure 3C:
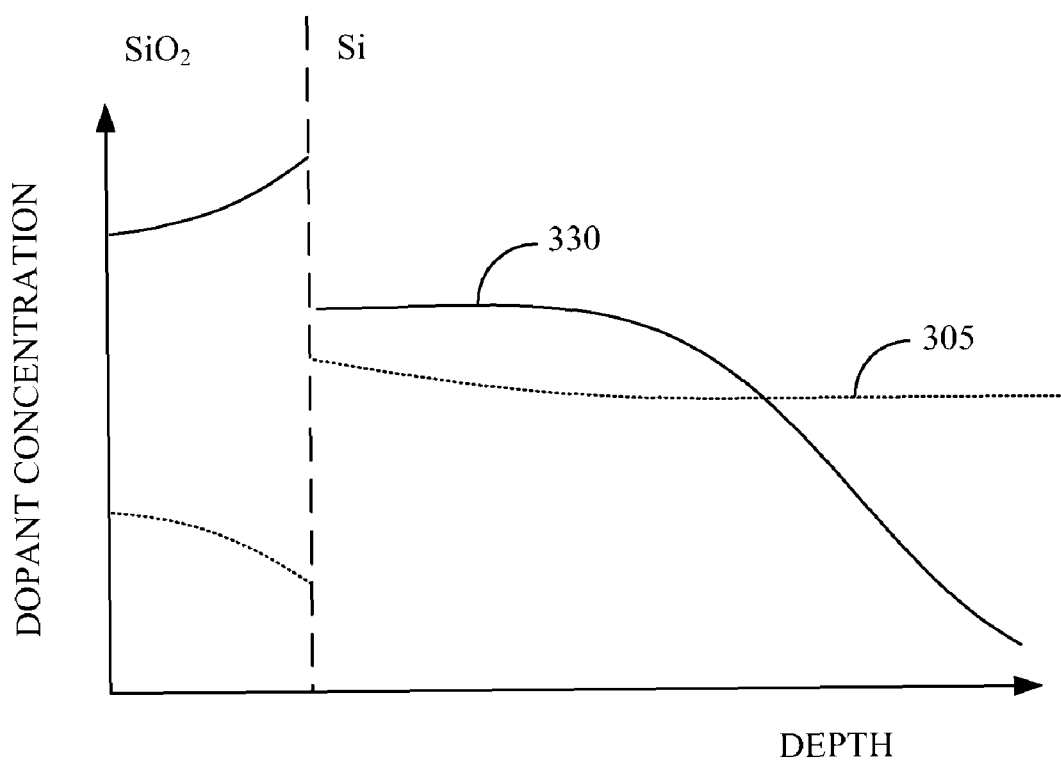
FIG. 3C depicts the dopant concentrations after a heat treatment has been used to thermally grow the oxide layer.

FIG. 3C depicts the dopant concentrations after a thermal oxidation process has been used to grow the insulating oxide layer. Thermal oxidation and the consequent growth of the oxide layer increases the depth of the oxide layer, as indicated by the shift of the vertical dashed line to the right relative to FIG. 3B. The dopant species migrate during the thermal oxidation process and so the dopant profiles 310, 320 have merged to form a single dopant profile 330. Dopant segregation has increased the concentration 330 of the p-type dopant in the oxide layer and decreased the concentration 330 of the p-type dopant in the silicon layer. For example, thermal oxidation can cause boron to migrate from the silicon layer into the silicon dioxide layer so that the chemical potential across the interface between these layers is approximately constant. The concentration 305 of the n-type dopant has slightly decreased in the oxide layer and remained approximately constant at approximately the same level as depicted in FIG. 3B.

The additional dopant implanted during the second dopant process depicted in FIG. 3B has increased the concentration of the dopant near the interface between the silicon layer and the oxide layer. Consequently, dopant segregation and the resulting decrease in the concentration 330 of the p-type dopant do not result in an inversion region being formed in the silicon layer. Instead, the additional dopant implanted during the second doping process acts as sacrificial material that can be consumed (e.g., the dopant can migrate into the oxide layer) during the thermal oxidation process so that the concentration 330 of the p-type dopants species remains larger than the concentration 305 of the n-type dopants species to a selected depth within the silicon layer. The selected depth is a matter of design choice. In various embodiments, the parameters of the first and second implant processes, as well as the thermal oxidation process, may be modified, selected, and/or adjusted to prevent the formation of the inversion layer within the region defined by the selected depth according to the techniques described herein.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the invention. Accordingly, the protection sought herein is as set forth in the claims below.

What is claimed:

1. A bipolar transistor, comprising:
    a substrate;
    a silicon layer formed over the substrate, the silicon layer being doped with a first type of dopant, and wherein:
        a first implant process implants dopant of a second type opposite the first type in the silicon layer, the implanted dopant having a first dopant profile in the silicon layer; and
        a second implant process implants additional dopant of the second type in the silicon layer, the additional implanted dopant having a second dopant profile in the silicon layer different than the first dopant profile;
    an insulating layer formed by a thermal oxidation process that grows the insulating layer after doping the silicon layer by consuming a portion of the silicon layer and a portion of the dopant of the second type such that the concentration of the dopant of the second type is higher than the concentration of the dopant of the first type from an interface between the silicon layer and the insulating layer to a selected depth in the silicon layer, and wherein the concentration of the dopant of the second type is higher in the insulating layer than in the silicon layer.

2. The bipolar transistor of claim 1, wherein the substrate comprises at least one of a silicon substrate or a silicon-on-insulator substrate.

3. The bipolar transistor of claim 2, wherein the silicon layer is a doped silicon layer deposited on the substrate.

4. The bipolar transistor of claim 2, wherein the silicon layer is an undoped silicon layer deposited on the substrate before the dopant of the first type is implanted in the undoped silicon layer.

5. The bipolar transistor of claim 1, comprising dopant implanted in the silicon layer by the first implant process to have, prior to growing the insulating layer, a first dopant profile that has a first peak at a first depth in the silicon layer.

6. The bipolar transistor of claim 5, comprising dopant implanted in the silicon layer by the second implant process to have, prior to growing the insulating layer, a second dopant profile that has a second peak at a second depth in the silicon layer, the second implant process using a lower energy than the first implant process so that the second depth is shallower than the first depth, a portion of the dopants being deposited in the insulating layer.

7. The bipolar transistor of claim 6, wherein a dopant concentration at the first peak is larger than a concentration of the first type of dopant in the silicon layer.

8. The bipolar transistor of claim 7, wherein a dopant concentration at the second peak is larger than the dopant concentration at the first peak.

9. The bipolar transistor of claim 8, wherein the insulating layer comprises an oxide layer and wherein the insulating layer is grown from the oxide layer using thermal oxidation to cause a portion of the dopant in the first and second dopant profiles to migrate into the oxide layer.

10. The bipolar transistor of claim 9, wherein the concentration of the second type of dopant remains, after growing the insulating layer, larger than the concentration of the first type of dopant at the interface between the insulating layer and the silicon layer so that the chemical potential across the interface between the insulating layer and the silicon layer is approximately constant.

11. The bipolar transistor of claim 10, wherein the first and second dopant profiles merge during the thermal oxidation process so that the concentration of the dopant of the second type is larger than the concentration of the dopant of the first type proximate an interface between the silicon layer and the insulating layer.

12. A bipolar transistor, comprising:
a substrate;
a silicon layer formed over the substrate, the silicon layer being doped with a first type of dopant and implanted with a dopant of a second type opposite the first type in the silicon layer; and
an insulating layer formed by consuming a portion of the silicon layer and a portion of the dopant of the second type such that the concentration of the dopant of the second type is higher than the concentration of the dopant of the first type from an interface between the silicon layer and the insulating layer to a selected depth in the silicon layer, and wherein the concentration of the dopant of the second type is higher in the insulating layer than in the silicon layer.

13. The bipolar transistor of claim 12, wherein the substrate comprises at least one of a silicon substrate or a silicon-on-insulator substrate.

14. The bipolar transistor of claim 12, wherein the silicon layer is a doped silicon layer deposited on the substrate.

15. The bipolar transistor of claim 12, wherein the silicon layer is an undoped silicon layer deposited on the substrate before the dopant of the first type is implanted in the undoped silicon layer.

16. The bipolar transistor of claim 12, wherein the concentration of the dopant of the second type is higher than the concentration of the dopant of the first type at the interface so that the chemical potential across the interface between the insulating layer and the silicon layer is approximately constant.

* * * * *